United States Patent [19]

Fiorella

[11] Patent Number: 4,736,190
[45] Date of Patent: Apr. 5, 1988

[54] SHEET MEMBRANE KEYBOARD AND ELECTRONIC APPARATUS USING SAME

[75] Inventor: Charles M. Fiorella, Sunrise, Fla.

[73] Assignee: Texas Instruments Incorporated, Dallas, Tex.

[21] Appl. No.: 784,720

[22] Filed: Oct. 7, 1985

Related U.S. Application Data

[63] Continuation of Ser. No. 438,066, Nov. 1, 1982, abandoned.

[51] Int. Cl.⁴ ............................................. G06F 3/02
[52] U.S. Cl. ........................... 340/365 A; 340/365 R; 200/5 A
[58] Field of Search ........... 340/365 C, 365 A, 365 R; 200/5 A, 159 B, 160; 364/700, 705, 707, 709; 178/18; 400/477, 485

[56] References Cited

U.S. PATENT DOCUMENTS

| | | | |
|---|---|---|---|
| 4,046,975 | 9/1977 | Seeger | 200/5 A |
| 4,143,253 | 3/1979 | Wagner | 200/5 A |
| 4,149,029 | 4/1979 | Pobgee | 178/18 |
| 4,263,485 | 4/1981 | Corwin | 200/5 A |
| 4,263,659 | 4/1981 | Hirata et al. | 364/709 |
| 4,274,752 | 6/1981 | Huber | 340/365 C |
| 4,302,648 | 11/1981 | Sado | 200/5 A |
| 4,313,108 | 1/1982 | Yoshida | 340/365 VL |
| 4,324,962 | 4/1982 | Dulen | 200/5 A |
| 4,336,529 | 6/1982 | Buan | 340/365 R |
| 4,365,408 | 12/1982 | Ditzig | 200/5 A |
| 4,377,049 | 3/1983 | Simon et al. | 340/365 C |
| 4,413,252 | 11/1983 | Tyler et al. | 340/365 C |
| 4,420,663 | 12/1983 | Larson | 200/5 A |
| 4,460,810 | 7/1984 | Fukukura | 200/5 A |
| 4,567,469 | 1/1986 | Danish et al. | 340/365 C |

OTHER PUBLICATIONS

Sharp, "Non-Mechanical Keyboard", IBM Technical Disclosure Bulletin, vol. 5, No. 12, May 1963.

Primary Examiner—John W. Caldwell, Sr.
Assistant Examiner—Mahmoud Fatahi-Yar
Attorney, Agent, or Firm—William E. Hiller; N. Rhys Merrett; Melvin Sharp

[57] ABSTRACT

The present invention is a simplified membrane keyboard employing a single flexible sheet. This membrane keyboard is employed in an electronic apparatus having an external case with a nonconducting keyboard surface. This nonconducting keyboard surface has a plurality of depressions corresponding to key switch positions. The keyboard surface is covered by a keyboard sheet. This keyboard sheet has a flexible membrane with opposed first and second surfaces, the first surface disposed adjacent to and substantially covering the keyboard surface of the external case. An interconnection pattern is placed upon the first surface of the flexible membrane. This interconnection pattern has a plurality of conductors and most particularly has a pair of conductors in proximity at each key switch position. Pressure applied to the second surface of the flexible membrane causes the flexible membrane to flex until the two conductors contact a conductive layer disposed in the bottom of the corresponding depression. This contact causes electrical conduction between the two conductors, thereby giving rise to a closed key operation. In a preferred embodiment graphic matter identifying the key areas of the flexible sheet, that is those areas overlying the depressions, is applied to the second surface of the flexible sheet. This invention is adapted for use in calculators, electronic learning aids, electronic games, small computer systems and other electronic apparatuses which employ keyboards.

6 Claims, 6 Drawing Sheets

SHEET MEMBRANE KEYBOARD AND ELECTRONIC APPARATUS USING SAME

This application is a continuation of application Ser. No. 438,066, filed 11-1-82, now abandoned.

BACKGROUND OF THE INVENTION

A general problem in the construction and use of many types of electronic apparatuses is the generation of input and control signals to the apparatus. In a typical electronic apparatus, and most particularly in portable, hand held electronic apparatuses, a keyboard is employed to make the electronic apparatus responsive to the user. Such keyboards typically include a plurality of momentary contact key switches. The electronic apparatus is constructed in order to be responsive to the closing of these momentary contact key switches, either along or in combination. Employing this technique it is possible for the operator to cause the electronic apparatus to perform the desired function.

A particularly advantageous manner for providing a keyboard for an electronic apparatus is the so called membrane keyboard. Such a membrane keyboard is low in cost and provides the advantage that it greatly reduces the number of holes necessary in the case of the electronic apparatus. This is advantageous for electronic apparatuses such as electronic learning aids or electronic games which are primarily used by children, because a membrane keyboard greatly reduces the risk of dirt or other foreign matter getting inside the case of the electronic apparatus.

The typical membrane keyboard includes a plurality of layers or separate sheets of a flexible material. Generally, a top sheet will have a plurality of row conductors imprinted thereon. A bottom sheet will have a plurality of column conductors imprinted thereon. A third sheet, which serves as both an insulator and a spacer is placed between the top and bottom sheets. This third sheet has a plurality of holes cut therein, each hole corresponding to a crossing position between a row conductor and a column conductor. In such a membrane keyboard, the row conductors and column conductors are normally held apart and prevented from making electrical contact by the insulating and spacing sheet. However, pressure applied to the top sheet at a position corresponding to an intersection between a row conductor and a column conductor, causes the top sheet to flex thereby bringing the row conductor and column conductor into electrical contact. This electrical contact is sensed as a switch closure by the electronic apparatus, thereby enabling the electronic apparatus to be responsive to the user. Release of the pressure on the top sheet causes the top sheet to return to its former position, thereby opening the electrical connection between the row conductor and the column conductor. However, the requirement for three separate sheets within this membrane keyboard makes the membrane keyboard more complicated and more expensive than could be achieved if one or more of these sheets could be eliminated.

SUMMARY OF THE INVENTION

It is an object of the present invention to provide a membrane keyboard employing only a single flexible membrane. This object is accomplished by employing a portion of the exterior case of the electronic apparatus as a part of the keyboard.

The exterior case of the electronic apparatus is constructed having a keyboard surface. This keyboard surface includes a plurality of depressions disposed at positions corresponding to the desired key switch positions. This keyboard surface must be nonconducting. Each of these depressions has a layer of conductive material, preferably a conductive transfer ink, disposed at the bottom thereof.

The single flexible membrane has opposed first and second flexible surfaces. The first surface of the single sheet flexible membrane is disposed adjacent to and substantially covers the keyboard surface of the exterior case. The first surface of the flexible membrane has a conductive interconnection pattern disposed thereon. This interconnection pattern includes a pair of conductors in proximity corresponding to each of the key switch positions.

Normally the pair of conductors is spaced apart from and insulated from the conductive layer at the bottom of the depression by virtue of the depth of this depression. Application of pressure on the second surface of the flexible membrane in the vicinity of a key switch position causes the flexible membrane to flex until the pair of conductors contact the conductive layer. This contact causes electrical coupling between the pair of conductors, which is detected by the electronic apparatus as a key closure. Release of the pressure upon the second surface of the flexible sheet causes the flexible sheet to return to its former position, thereby breaking the electrical coupling between the two conductors.

In a further embodiment of the present invention, one or more insulating layers are deposited upon the first surface of the flexible sheet overlying portions of the interconnection pattern. Thereafter a second set of conductors is deposited on the first surface of the flexible membrane overlying the previously deposited insulating layers. By this means a set of jumpers may be applied, thereby enabling construction of a much more complicated interconnection pattern on the first surface of the flexible membrane. Employing such a system a so called matrix keyboard may be easily achieved.

In a further embodiment of the present invention, the flexible membrane includes a tail portion having a plurality of conductors as part of the interconnection pattern disposed thereon. This tail portion may be inserted into a slot within the exterior case of the electronic apparatus thereby enabling other portions of the electronic apparatus to be electrically coupled to the keyboard via these conductors within the tail.

In a further embodiment, the second surface of the flexible sheet has graphic identifying characters imprinted thereon. These graphic identifying characters are preferably placed in positions corresponding to the key switch positions. By this means, the exposed second surface of the flexible membrane may include labels enabling the operator to reliably contact the proper position on the flexible membrane to close the desired key switch.

BRIEF DESCRIPTION OF THE DRAWINGS

These and other objects and aspects of the present invention will become clear from the following detailed description taken in conjunction with the drawings in which.

DETAILED DESCRIPTION OF THE PREFERRED EMBODIMENT

Figure 1:
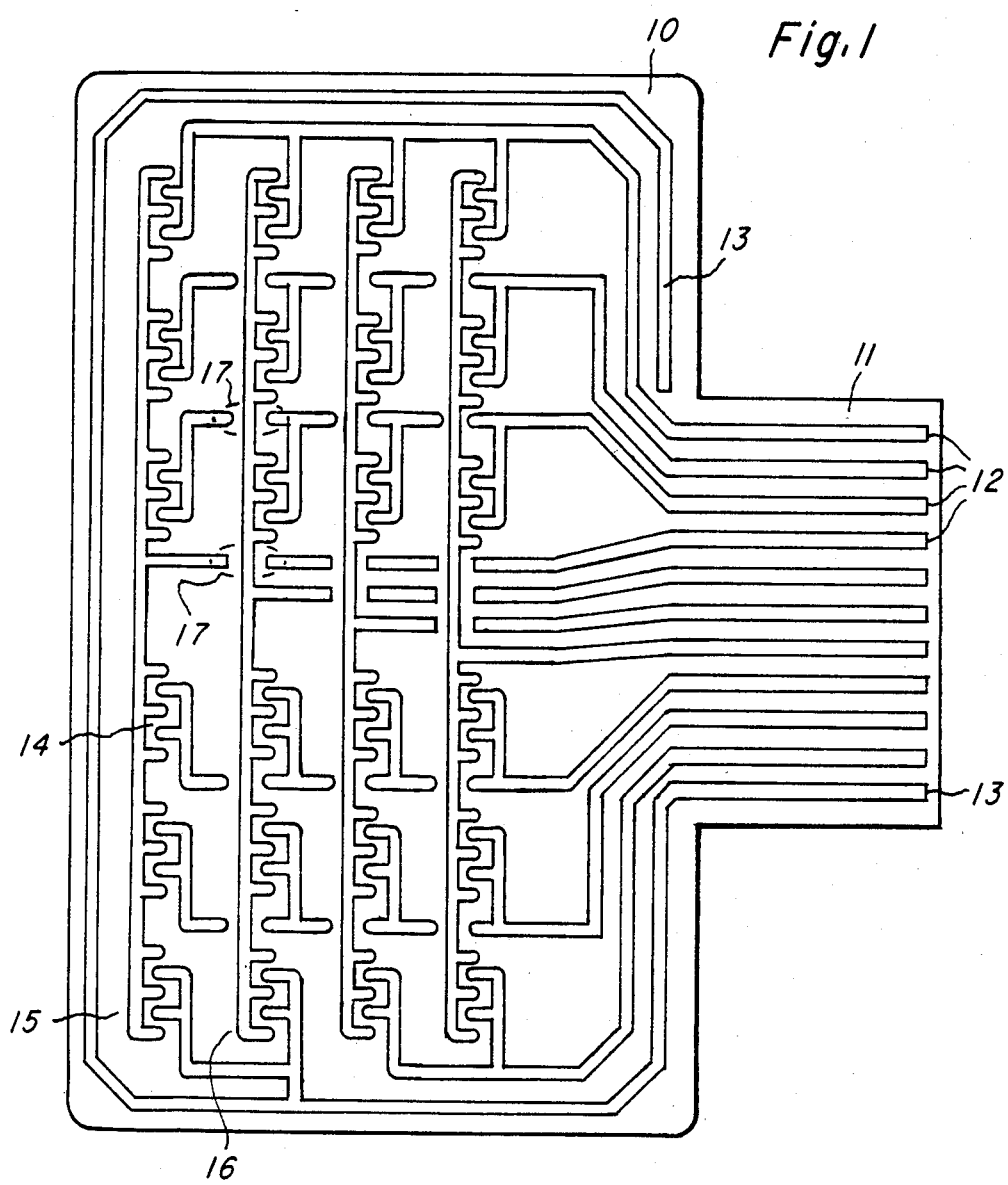
FIG. 1 illustrates an embodiment of the first interconnection pattern disposed on the first surface of the flexible membrane in accordance with the teaching of the present invention.
Figure 2:
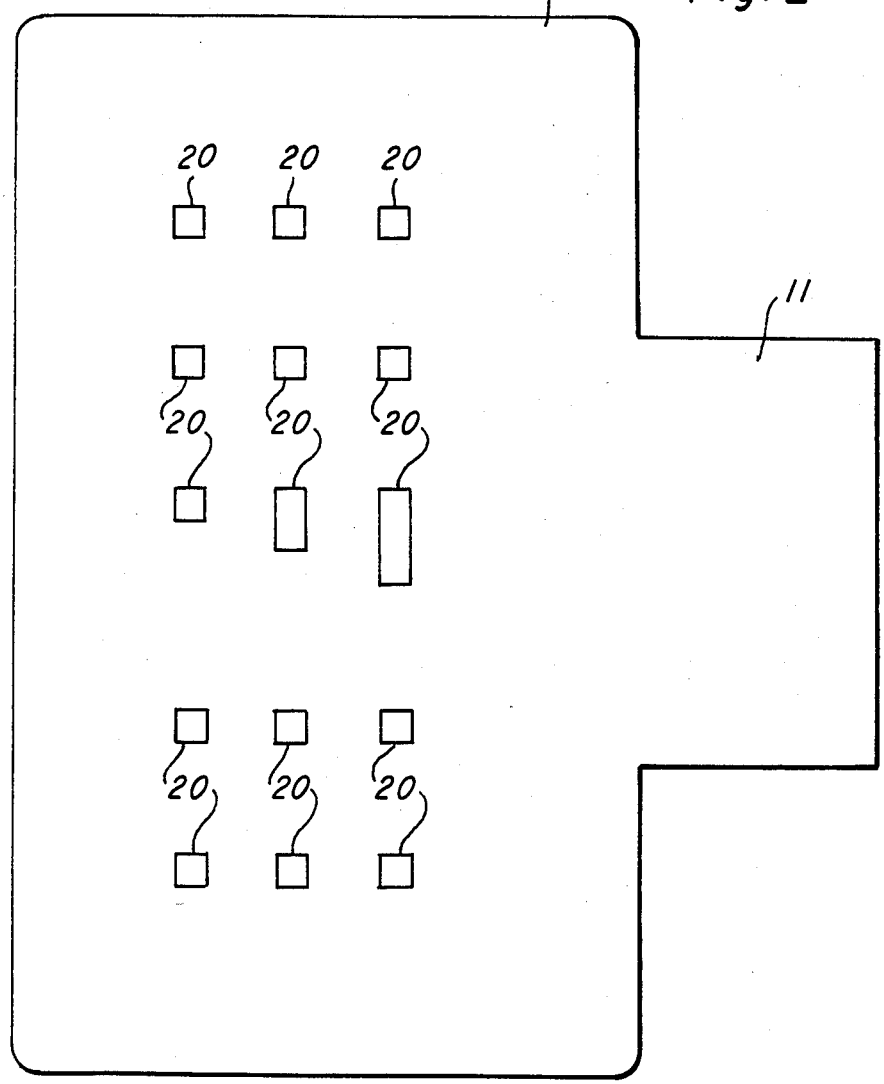
FIG. 2 illustrates the pattern of insulated layers disposed on first side of the flexible sheet in accordance to one embodiment of the present invention.
Figure 3:
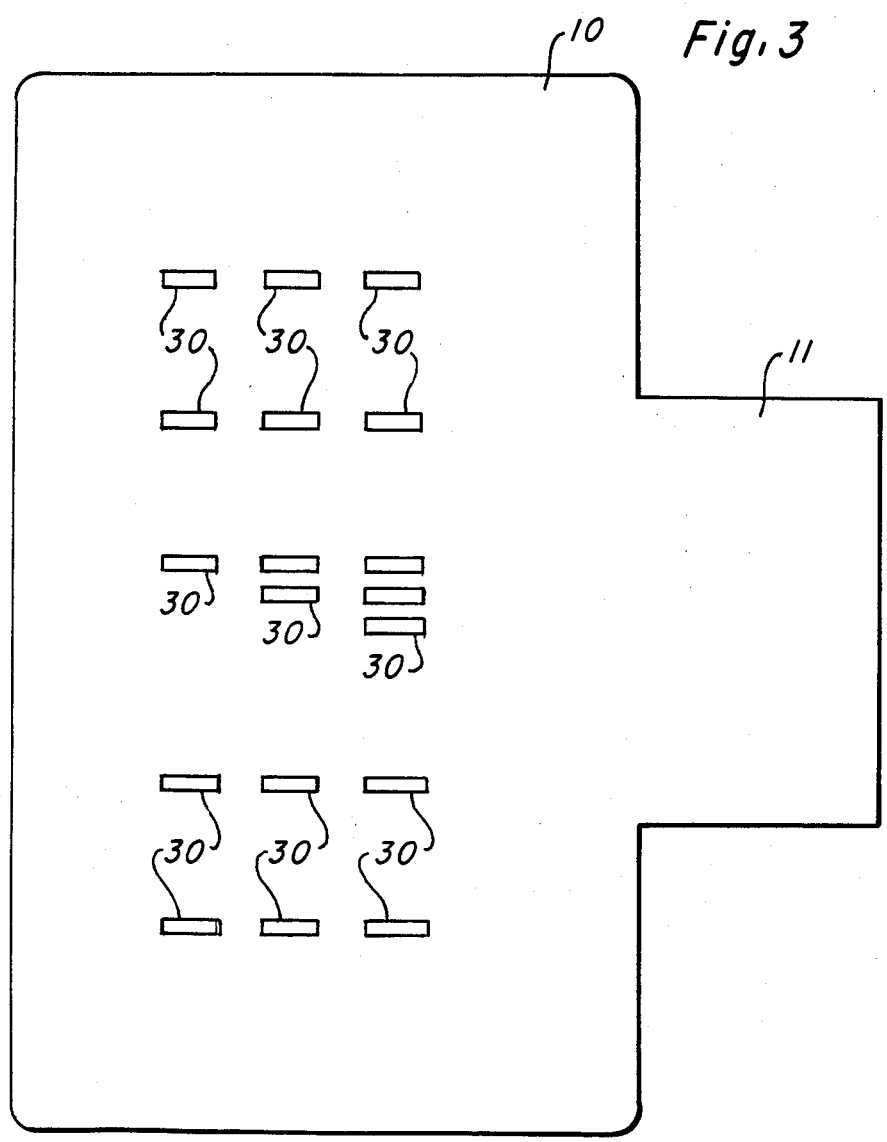
FIG. 3 illustrates the pattern of the second or jumper interconnection pattern disposed on the first surface of the flexible sheet.

FIGS. 1, 2 and 3 illustrate the patterns necessary to construct a twenty four key matrix keyboard on a single sheet. FIG. 1 illustrates a first conductive pattern. FIG. 2 illustrates an insulative pattern. FIG. 3 illustrates a second conductive pattern or jumper pattern.

FIG. 1 illustrates the first conductive pattern on the flexible sheet 10. Flexible sheet 10 includes a tail portion 11 and has an interconnection pattern disposed thereon including a plurality of conductors 12. The first conductive pattern on flexible membrane 10 includes a plurality of key switch positions 14. Each key switch position 14 has a pair of conductors arranged in an interleaved comb pattern.

The first conductive pattern illustrated in FIG. 1 includes conductor 13 which is disposed around the periphery of the first surface of flexible membrane 10. This conductor 13 is connected to one of the pair of conductors of key switches 15 and 16. Conductor 13 is preferably connected to one terminal of the power supply and provides a ground plane for the keyboard. This ground plane is necessary to minimize the buildup of static charge which is particularly troublesome if the electronic apparatus includes one or more metal oxide semiconductor devices which are sensitive to static charge.

In accordance with the teachings of U.S. Pat. No. 4,115,705 "Electronic Calculator with Push-Button On-Off System" issued Sept. 19, 1978 to David J. McElroy, the keyboard illustrated in FIG. 1 includes key switch 15 and key switch 16, each having one of their two conductors connected to the fixed potential of conductor 13. In accordance with the teachings of the above cited patent, key switches 15 and 16 may then be employed as momentary contact on and off switches.

The other key switches 14 illustrated in FIG. 1 are disposed in a matrix form, that is each key switch has one of its pair of conductors connected in a column and the other of its pair of conductors connected in a row. Tail portion 11 includes conductors 12 and conductor 13. Together these conductors available at tail 11 include all of the lines necessary to sense the closure of any of key switches 14, 15 or 16.

Flexible membrane 10 is preferably manufactured of a single sheet of flexible material. This single sheet may be constructed of vinyl, mylar or polycarbonate. As will be further explained below, a vinyl sheet is preferable because this enables easier application of graphics to the second surface of the sheet.

The first conductive pattern illustrated in FIG. 1 is preferably transfer printed onto the first surface of flexible membrane 10. A conductive ink formed of approximately 50% silver ink and 50% graphite ink may be employed for this conductive pattern. Other types of conductive ink could be employed instead. This is preferably applied to flexible sheet 10 by a silk screening or lithographic process. In addition, a conductive ink of the pure solvent type or of the ultraviolent light cure type may also be employed.

FIG. 2 illustrates the insulative pattern applied to the first surface of flexible membrane 10 after the application of the first conductive pattern. This insulative pattern includes a plurality of small insulators 20. Each of the small insulators 20 is disposed on the previously deposited first conductive pattern at one of the crossover points 17 (illustrated in FIG. 1). The insulative patatern is preferably formed of an insulative ink transfer printed on the surface of flexible membrane 10 over the first interconnection pattern in a manner similar to the deposition of the first insulative pattern.

FIG. 3 illustrates the second conductive pattern or jumper pattern. The second conductive pattern includes a plurality of conductors 30, each of which is disposed at a position corresponding to one of the crossovers 17 illustrated in FIG. 1. The second conductive pattern is preferably deposited on the first surface of the flexible membrane 10 over the combination of the first conductive pattern and the insulative pattern. This second conductive pattern may be applied in the same manner as the first conductive pattern. Application of insulators 20 and jumpers 30 to the crossover points 17 enables construction of one or more conductor crossing patterns on the surface of flexible membrane 10. This provision for a crossover pattern enables more complicated interconnection patterns to be formed on the flexible membrane 10 than would be possible without such crossing patterns. This enables construction of more complicated keyboards than would otherwise be possible.

Figure 4:
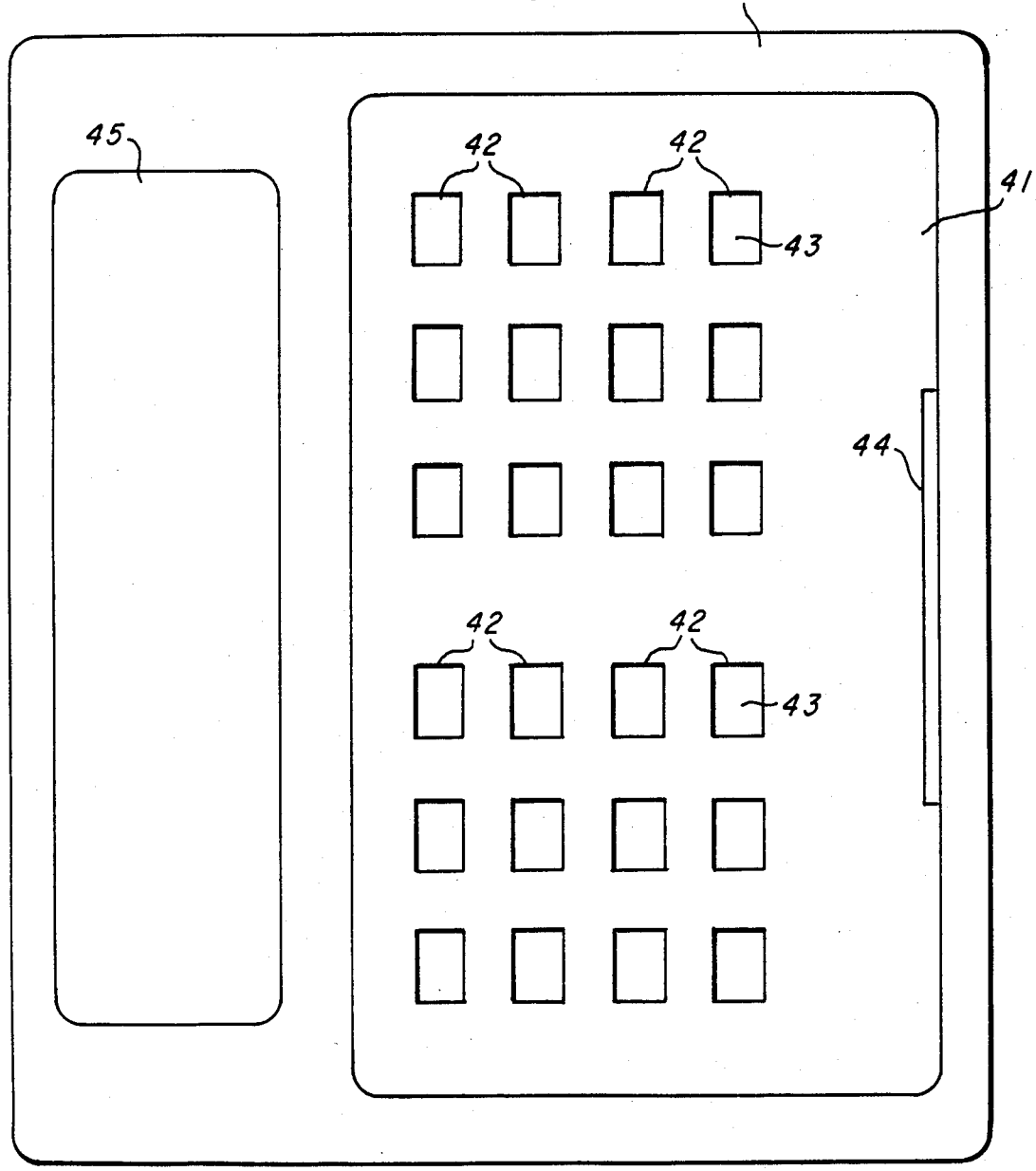
FIG. 4 illustrates an embodiment of the front portion of the exterior case of an electronic apparatus constructed in accordance with the present invention.

FIG. 4 illustrates a view of the front case of an electronic apparatus employing the single sheet membrane keyboard of the present invention. FIG. 4 illustrates front case 40. Front case 40 has a keyboard area 41. This keyboard area 41 has the same outline as the flexible membrane 10, with the exception of the tail portion 11. The keyboard portion 41 is preferably substantially flat with the exception of a plurality of depressions 42. Each depression 42 is disposed at a location within keyboard surface 41 corresponding to one of the key switches 14, 15, or 16. In a preferred embodiment, front case 40 is constructed of an injection molded plastic. Because front case 40 is formed of plastic, keyboard surface 41 is nonconducting. Of course front case 40 may be formed in a different manner and from different material as long as keyboard surface 41 is nonconducting. Proper construction of the mold for front case 40 permits construction of a substantially flat keyboard surface 41 which has depressions 42 as described. The bottom of each depression 42 includes a conductive layer 43 disposed at the bottom thereof. This conductive layer 43 preferably comprises a layer of conductive ink transfer printed into the bottom of the depressions 42. This transfer ink may be of the same type as employed in manufacture of the first and second conductive patterns placed upon flexible membrane 10.

Front case 40 contains a pair of apertures 44 and 45. Aperture 44 is preferably a slot opening disposed within keyboard surface 41 at a position corresponding to tail portion 11 of flexible membrane 10. During assembly the tail portion 11 of the single sheet keyboard is inserted into slot 44 and the first surface including the interconnection pattern of flexible membrane 10 is glued on to keyboard surface 41. This assembly provides registration of each of the key switches 14, 15 and 16 with a corresponding depression 42 and conductive layer 43.

Also included within front case 40 is a display opening 45. In the preferred embodiment, a visual display such as a liquid crystal display, a light emitting diode display or a vacuum fluorescent display is placed within the case of the electronic apparatus so that it may be viewed through display aperture 45 within top case 40. This display is employed to communicate to the operator of the apparatus the results and the operational state of the apparatus. Other forms of communication between the apparatus and the operator are possible. As an example, an electromagnetic or piezoelectric transducer could be employed to enable musical tone or synthesized speech output. In such a case front case 40 must be constructed to accommodate the transducer rather than a visual display.

Figure 5:
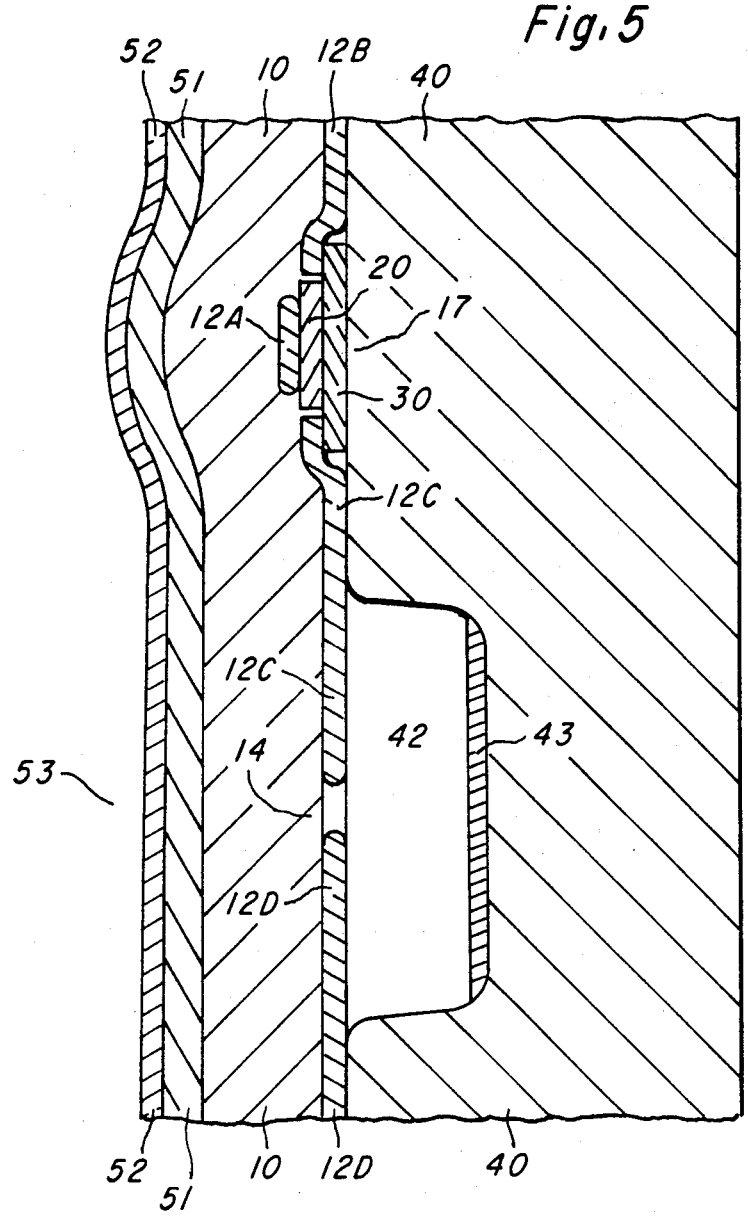
FIG. 5 illustrates a cross section of the single sheet membrane keyboard of the present invention.

FIG. 5 illustrates a cross sectional view of the membrane keyboard of the present invention. FIG. 5 includes a view of a typical crossover portion 17 and typical key switch position 53.

Flexible membrane 10 is disposed substantially over the surface of top case 40. On the upper surface of flexible membrane 10, away from top case 40, is disposed a graphics layer 51 and a protective layer 52. Graphics layer 51 preferably includes characters, words, names and colors which properly identify each key switch position of the membrane keyboard. This graphics layer 51 enables proper operator identification of the various key switch positions of the membrane keyboard, thereby permitting the operator to properly select the desired key closures for the desired machine operation. Graphics layer 51 is preferably printed upon the top surface of flexible membrane 10 by an ordinary printing process. As noted above, it is preferable to employ a vinyl sheet for flexible membrane 10 because such vinyl material more easily accepts the printed graphic layer 51. Also placed upon the upper surface of the membrane keyboard is a protective layer 52 which may be composed of a transparent mylar layer. This protective layer preferably is employed to minimize wear and rub off of the graphics layer, thereby extending the useful life of the membrane keyboard.

On the other surface of flexible membrane 10, that is the surface which faces top case 40 of the apparatus, the first conductive pattern, the insulative pattern and the second conductive pattern are disposed. FIG. 5 illustrates conductors 12A, 12B, 12C and 12D, each of which is formed as a part of the first conductive pattern. Conductor 12A is illustrated in cross section and passes approximately perpendicular to the cross sectional view illustrated in FIG. 5. Conductors 12B, 12C and 12D preferably extend substantially in parallel to the cross sectional view illustrated in FIG. 5. The region between conductors 12A, 12B and 12C forms a crossover area 17. As explained above, an insulative pattern is disposed upon the first surface of flexible membrane 10 at positions corresponding to the crossover portion 17. As illustrated in FIG. 5, insulator 20 is disposed on top of conductor 12A and between conductors 12B and 12C. The second conductive pattern includes a jumper 30 which is disposed over the insulator 20 and is placed in contact with both conductors 12B and 12C of the first conductive pattern. As a result of this construction, a continuous electrical path from conductor 12B, through jumper 30 to conductor 12C is constructed. This continuous electrical path is insulated from the crossing electrical path of conductor 12A via insulative layer 20.

Also illustrated in FIG. 5 is the operation of key 14 at key switch position 53. Key 14 includes a pair of conductors, 12C and 12D, which are disposed upon the surface of flexible membrane 10 in registration with a corresponding deprssion 42 in top case 40. This area of the keyboard is a key switch position 53. Pressure upon the external face of the membrane keyboard in the area of key switch position 53 causes membrane 10 to flex until both conductors 12C and 12D are in contact with conductive layer 43 placed at the bottom of depression 52. This simultaneous contact causes a continuous electrical path from conductor 12C through conductive layer 43 to conductor 12D. As explained above, this may be detected by proper sensing upon the conductors 12 appearing at the ends of tail portion 11 as a closed key switch. Removal of the pressure on the exterior of key switch position 53 causes flexible membrane 10 to regain its original position, thereby disconnecting the electrical path between conductors 12C and 12D. This disconnection of the electrical path is sensed as an open key switch.

Figure 6:
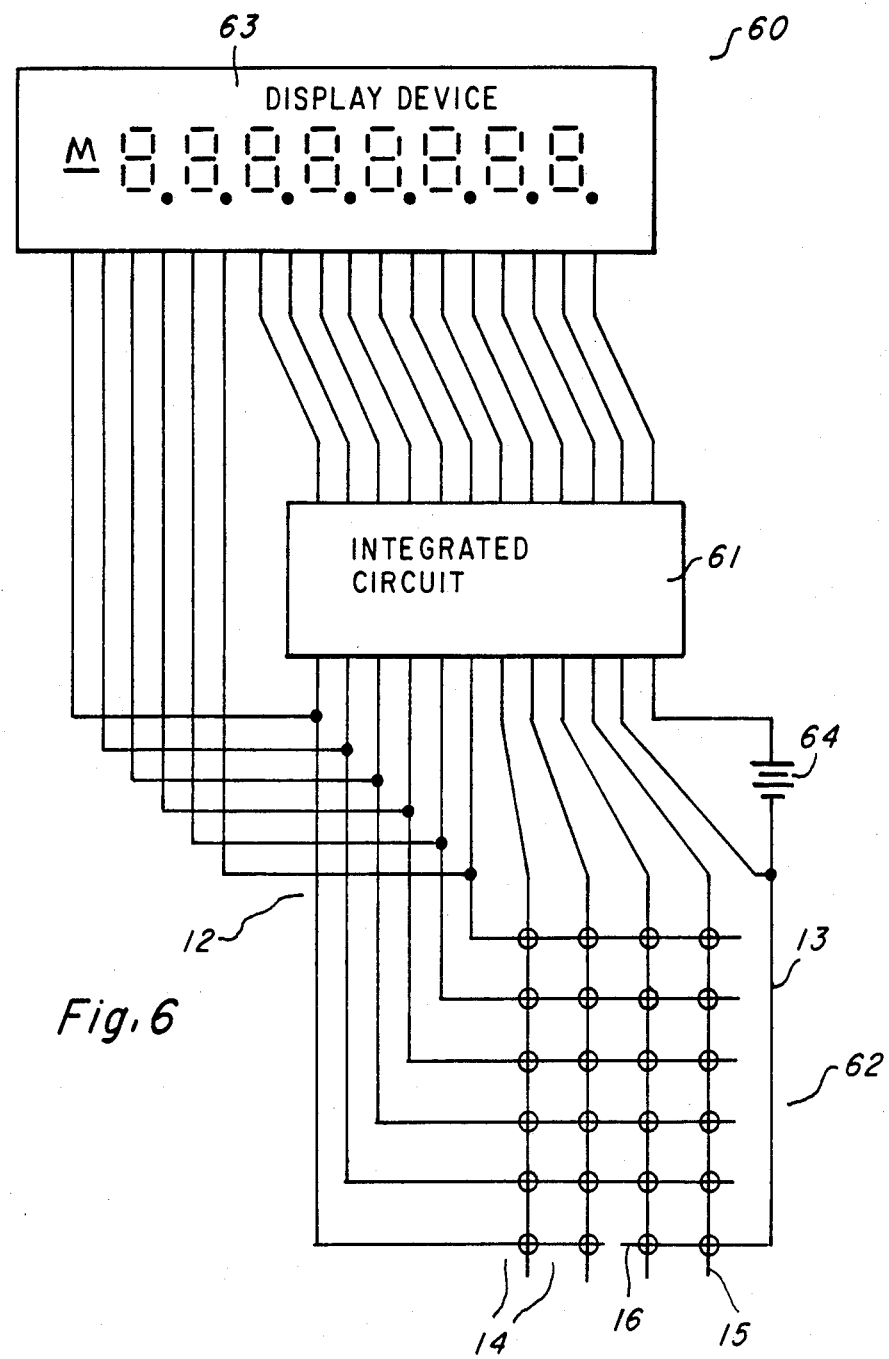
FIG. 6 illustrates a schematic diagram of one embodiment of an electronic apparatus employing the single sheet membrane keyboard of the present invention.

FIG. 6 illustrates a schematic diagram of an electronic apparatus 60 such as may employ a membrane keyboard constructed in accordance with the teachings of the present invention. Electronic apparatus 60 consists of primarily an integrated circuit 61, the membrane keyboard 62, display device 63 and power supply 64.

The integrated circuit 61 is preferably constructed in accordance with the teachings of U.S. Pat. No. 4,242,657 "Display and Keyboard Scanning for Electronic Calculator or the Like" issued Dec. 30, 1980 to Gary W. Boone and Michael J. Cochran. In accordance with the teachings of this patent, integrated circuit 61 generates a plurality of scan signals which are applied simultaneously to the keyboard 62 and to the display device 63. These scan signals are applied to the row conductors of keyboard 62. The column conductors of keyboard 62 are connected to individual inputs of integrated circuit 61. Similarly, the scan conductors are applied to display device 63 and additional conductors are connected directly to integrated circuit 61. The completed circuit is preferably constructed in accordance with the teachings of U.S. Pat. No. 4,326,265 "Variable Function Programmed Calculator" issued Apr. 20, 1982 to Garu W. Boone. In the preferred embodiment, integrated circuit 61, display device 63 and power supply 64 are disposed within the exterior case of the apparatus. In addition, display device 63 is preferably disposed in a position for viewing through display aperture 45 in the top case 40.

It will be understood by those skilled in the art that the membrane keyboard constructed in accordance with the teachings of the present application can be used in other electronic apparatuses besides the particular apparatus illustrated in FIG. 6. Specifically, other forms of output device differing from visual display device 63 such as tone generating device or a speech synthesis circuit may be employed. In addition, it is possible to employ more than a single integrated circuit together with one or more discrete components in construction of an electronic apparatus embodying the teachings of the present invention. The primary teaching of the present invention is the employment of a conductive pattern on one surface of a single sheet membrane in conjunction with the conductive layer at the bottom of depressions formed in a nonconducting keyboard surface of the exterior case of the apparatus.

What is claimed is:

1. A keyboard structure for an electronic apparatus comprising:
    a body of non-conductive material providing a keyboard surface;
    said body of non-conductive material having a plurality of spaced depressions formed therein to extend partially through the thickness thereof, said spaced depressions opening onto said keyboard surface and respectively located at corresponding key switch positions;
    an electrically conductive layer disposed at the bottom of each of said depressions within said body of non-conductive material;
    a keyboard sheet including a flexible membrane of non-conductive material having opposing first and second surfaces, said first surface being disposed adjacent to and substantially covering said keyboard surface;
    an interconnection pattern including a plurality of electrical conductors disposed on said first surface of said flexible membrane facing said keyboard surface and arranged to provide a pair of electrical conductors in proximity at each of said key switch positions; and
    said flexible membrane flexing in a direction toward said keyboard surface of said body to move a respective pair of electrical conductors corresponding to a particular key switch position into engagement with said conductive layer disposed at the bottom of the depression located at the respective key switch position in response to pressure on said second surface of said flexible membrane selectively applied at said particular key switch position, whereby an electrical connection occurs between said respective pair of conductors via said conductive layer at the selected key switch position.

2. A keyboard structure as set forth in claim 1, wherein said interconnection pattern has a first set of electrical conductors in which the respective pairs of electrical conductors in proximity at each of said key switch positions are incorporated, said first set of electrical conductors being arranged to provide at least one crossover conductor group comprising a pair of conductors disposed on opposite sides of and transverse to another conductor interposed therebetween and in spaced relation thereto to define a crossover location.
    a pattern of insulating material overlying said first set of electrical conductors and including respective small insulators disposed on said first set of electrical conductors at each of said crossover locations, each said small insulator being positioned over said another conductor and extending between said pair of conductors disposed on opposite sides thereof of the respective crossover conductor group, and
    a second set of electrical conductors including respective electrical conductors disposed on said pattern of insulating material at each of said crossover locations, each said electrical conductor of said second set of electrical conductors being positioned over a small insulator and electrically connecting said pair of conductors of a respective crossover conductor group while being electrically insulated from said another conductor by said small insulator at the corresponding crossover location.

3. An electronic apparatus comprising:
    an exterior case adapted to contain electronic components and having a body portion of non-conductive material providing a keyboard surface outwardly disposed with respect to the interior of said case;
    said body portion of non-conductive material having a plurality of spaced depressions formed therein to extend partially through the thickness thereof, said spaced depressions opening onto said keyboard surface and respectively located at corresponding key switch positions;
    an electrically conductive layer disposed at the bottom of each of said depressions within said body portion of non-conductive material;
    a keyboard sheet including a flexible membrane of non-conductive material having opposing first and second surfaces, said first surface being disposed adjacent to and substantially covering said keyboard surface;
    an interconnection pattern including a plurality of electrical conductors disposed on said first surface of said flexible membrane facing said keyboard surface and arranged to provide a pair of electrical conductors in proximity at each of said key switch positions;
    said flexible membrane flexing in a direction toward said keyboard surface of said exterior case to move a respective pair of electrical conductors corresponding to a particular key switch position into engagement with said conductive layer disposed at the bottom of the depression located at the respective key switch position in response to pressure on said second surface of said flexible membrane selectively applied at said particular key switch position, whereby an electrical connection occurs between said respective pair of conductors via said conductive layer at the selected key switch position; and
    electronic circuit means disposed in said exterior case and connected to said interconnection pattern, said electronic circuit means including
    means for sensing an electrical connection between respective pairs of conductors at each of said key switch positions, and
    means for performing an electronic function and generating a result in response to sensed electrical connections between pairs of conductors corresponding to particular key switch positions.

4. An electronic apparatus as set forth in claim 3, wherein said interconnection pattern has a first set of electrical conductors in which the respective pairs of electrical conductors in proximity at each of said key switch positions are incorporated, said first set of electrical conductors being arranged to provide at least one crossover conductor group comprising a pair of conductors disposed on opposite sides of and transverse to another conductor interposed therebetween and in spaced relation thereto to define a crossover location.
    a pattern of insulating material overlying said first set of electrical conductors and including respective small insulators disposed on said first set of electrical conductors at each of said crossover locations, each said small insulator being positioned over said another conductor and extending between said pair of conductors disposed on opposite sides thereof of the respective crossover conductor group, and
    a second set of electrical conductors including respective electrical conductors disposed on said pattern of insulating material at each of said crossover locations, each said electrical conductor of said second set of electrical conductors being positioned over a small insulator and electrically connecting said pair of conductors of a respective crossover conductor group while being electrically insulated from said another conductor by said small insulator at the corresponding crossover location.

5. In an electronic apparatus, a keyboard structure comprising:
   an exterior case for the electronic apparatus adapted to contain electronic components thereof and having a body portion on non-conductive material providing a keyboard surface outwardly disposed with respect to the interior of said case;
   said body portion of non-conductive material having a plurality of spaced depressions formed therein to extend partially through the thickness thereof, said spaced depressions opening onto said keyboard surface and respectively located at corresponding key switch positions;
   an electrically conductive layer disposed at the bottom of each of said depressions within said body portion of non-conductive material;
   a keyboard sheet including a flexible membrane of non-conductive material having opposing first and second surfaces, said first surface being disposed adjacent to and substantially covering said keyboard surface;
   an interconnection pattern including a plurality of electrical conductors disposed on said first surface of said flexible membrane facing said keyboard surface and arranged to prvide a pair of electrical conductors in proximity at each of said key switch positions; and
   said flexible membrane flexing in a direction toward said keyboard surface of said exterior case to move a respective pair of electrical conductors corresponding to a particular key switch position into engagement with said conductive layer disposed at the bottom of the depression located at the respective key switch position in response to pressure on said second surface of said flexible membrane selectively applied at said particular key switch position, whereby an electrical connection occurs between said respective pair of conductors via said conductive layer at the selected key switch position.

6. In an electronic apparatus, a keyboard structure as set forth in claim 5 wherein said interconnection pattern has a first set of electrical conductors in which the respective pairs of electrical conductors in proximity at each of said key switch positions are incorporated, said first set of electrical conductors being arranged to provide at least one crossover conductor group comprising a pair of conductors disposed on opposite sides of and transverse to another conductor interposed therebetween and in spaced relation thereto to define a crossover location.

a pattern of insulating material overlying said first set of electrical conductors and including respective small insulators disposed on said first set of electrical conductors at each of said crossover locations, each said small insulator being positioned over said another conductor and extending between said pair of conductors disposed on opposite sides thereof of the respective crossover conductor group, and
   a second set of electrical conductors including respective electrical conductors disposed on said pattern of insulating material at each of said crossover locations, each said electrical conductor of said second set of electrical conductors being positioned over a small insulator and electrically connecting said pair of conductors of a respective crossover conductor group while being electrically insulated from said another conductor, by said small insulator at the corresponding crossover location.

* * * * *